(12) United States Patent
Kim

(10) Patent No.: US 6,246,084 B1
(45) Date of Patent: Jun. 12, 2001

(54) METHOD FOR FABRICATING SEMICONDUCTOR DEVICE COMPRISING CAPACITOR AND RESISTOR

(75) Inventor: Yong Chan Kim, Chungcheongbuk-do (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/188,408

(22) Filed: Nov. 10, 1998

(30) Foreign Application Priority Data

Dec. 5, 1997 (KR) ................................................ 97-66252

(51) Int. Cl.⁷ ................................................. H01L 27/108
(52) U.S. Cl. .......................... 257/296; 438/386; 438/399
(58) Field of Search ................................... 438/238, 239, 438/386, 399, 250, 387; 257/296

(56) References Cited

U.S. PATENT DOCUMENTS

| | | | |
|---|---|---|---|
| 5,434,098 | | 7/1995 | Chang ..................................... 437/60 |
| 5,618,749 | * | 4/1997 | Takahashi et al. .................... 438/384 |
| 5,656,524 | * | 8/1997 | Eklund et al. ........................ 438/238 |
| 5,714,410 | * | 2/1998 | Kim ....................................... 438/199 |
| 5,736,721 | * | 4/1998 | Shimomura et al. ................. 438/239 |
| 5,780,333 | * | 7/1998 | Kim ....................................... 438/238 |
| 6,004,841 | * | 12/1999 | Chang et al. ......................... 438/238 |

FOREIGN PATENT DOCUMENTS

| | | | |
|---|---|---|---|
| 5-21808 | * | 1/1993 | (JP) ..................................... 257/296 |
| 5-283634 | * | 10/1993 | (JP) ..................................... 257/296 |

* cited by examiner

*Primary Examiner*—Olik Chaudhuri
*Assistant Examiner*—Nathan W. Ha
(74) *Attorney, Agent, or Firm*—Fleshner & Kim, LLP

(57) ABSTRACT

A semiconductor device is disclosed, in which a capacitor lower electrode is formed of doped polysilicon and a capacitor upper electrode is formed of metal material to improve voltage coefficient characteristic. The semiconductor device includes a semiconductor substrate in which an active region and a field region are defined, a gate electrode and source and drain regions formed in the active region of the semiconductor substrate, a field oxide film formed in the field region of the semiconductor substrate, a capacitor lower electrode and a resistor formed of a doped polysilicon on the field oxide film, a capacitor dielectric film formed in a predetermined region on the capacitor lower electrode, and a capacitor upper electrode formed of metal material on the capacitor dielectric film.

9 Claims, 5 Drawing Sheets

METHOD FOR FABRICATING SEMICONDUCTOR DEVICE COMPRISING CAPACITOR AND RESISTOR

BACKGROUND OF THE INVENTION

1. Field of the Invention

The present invention relates to a semiconductor device, and more particularly, to a semiconductor device and a method for fabricating the same, which simplifies the process steps and improves characteristic of the device in simultaneously forming a CMOS device and an analog device (capacitor and resistor) on a semiconductor substrate.

2. Discussion of the Related Art

Generally, a CMOS analog device is formed in such a manner that NMOS and PMOS transistors are formed in an active region on a semiconductor substrate and a capacitor and a resistor are formed on a field oxide film.

A background art method for fabricating a semiconductor device will be described with reference to the accompanying drawings.

FIGS. 1a to 1e are sectional views illustrating a background art method for fabricating a semiconductor device.

As shown in FIG. 1a, a field oxide film 12 is formed in a field region of a semiconductor substrate 11 in which the field region and an active region are defined. Ions for adjustment of a threshold voltage are implanted into the active region of the semiconductor substrate 11. A gate insulating film 13 is then formed on the semiconductor substrate 11.

As shown in FIG. 1b, a first doped polysilicon is deposited on the gate insulating film 13 including the field oxide film 12. The first polysilicon is then patterned to form a gate electrode 14 of a MOS transistor, a capacitor lower electrode 15, and a resistor 16. At this time, the gate electrode 14 is formed in the active region of the semiconductor substrate 11 and the capacitor lower electrode 15 and the resistor 16 are formed on the field oxide film 12. The resistor 16 may be formed of a second polysilicon for a capacitor upper electrode, which will be formed later, instead of the first polysilicon.

As shown in FIG. 1c, impurity ions are implanted into the surface of the semiconductor substrate 11 at both sides of the gate electrode 14 using the gate electrode 14 as a mask to form source and drain impurity ion diffusion regions 17 and 17a.

Thereafter, a capacitor dielectric film 18 and a capacitor upper electrode 19 are sequentially formed on the capacitor lower electrode 15. At this time, the capacitor upper electrode 19 is patterned with a width smaller than the capacitor lower electrode 15. An oxide film, a nitride film, and a stacked film of the oxide film and the nitride film may be used as the capacitor dielectric film 18.

Subsequently, as shown in FIG. 1d, a sidewall 20 is formed at both sides of the gate electrode 14, the resistor 16, the capacitor lower electrode 15 and the capacitor upper electrode 19. An insulating film 21 for prevention of silicide is formed in a predetermined region on the resistor 16 so as not to form a silicide which will be formed later.

A refractory metal for the formation of silicide, such as tungsten, titanium, and the like, is formed on the entire surface of the semiconductor substrate 11 and then annealed. As a result, a silicide film 22 is formed on gate electrode 14, the semiconductor substrate 11 at both sides of the gate electrode 14, the capacitor upper electrode 19, some portion of the capacitor lower electrode 15 which is not masked by the capacitor upper electrode 19, and the resistor 16 on which the insulating film 21 is not formed.

As shown in FIG. 1e, an insulating film 23 is formed on the entire surface of the semiconductor substrate 11 including the silicide film 22. The insulating film 23 is then selectively removed to expose the surface of the silicide film 22. A contact hole is formed on the exposed surface of the silicide film 22. The contact hole is then plugged to form a plug 24 which is connected with the silicide film 22.

A metal is deposited on the entire surface including the plug 24 and then patterned to form a metal line 25. As a result, the process steps of fabricating the background art semiconductor device are completed.

However, the background art method for fabricating the semiconductor device has several problems.

Since the capacitor upper and lower electrodes are formed of doped polysilicon, voltage coefficient characteristic is poor, which shows variation width of the capacitance value in unit by the voltages of the upper and lower electrodes. This deteriorates characteristic of the analog device. To improve such characteristics, it is necessary to control the density of the impurity ions as thick as possible. However, it is difficult to improve such characteristics because there is limitation in making the impurity ions thick.

SUMMARY OF THE INVENTION

Accordingly, the present invention is directed to a semiconductor device and a method for fabricating the same that substantially obviate one or more of the problems due to limitations and disadvantages of the related art.

An object of the present invention is to provide a semiconductor device and a method for fabricating the same, in which a capacitor lower electrode is formed of doped polysilicon and a capacitor upper electrode is formed of metal material to improve voltage coefficient characteristic.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a semiconductor device according to the present invention includes a semiconductor substrate in which an active region and a field region are defined, a gate electrode and source and drain regions formed in the active region of the semiconductor substrate, a field oxide film formed in the field region of the semiconductor substrate, a capacitor lower electrode and a resistor formed of a doped polysilicon on the field oxide film, a capacitor dielectric film formed in a predetermined region on the capacitor lower electrode, and a capacitor upper electrode formed of metal material on the capacitor dielectric film.

In another aspect, a method for fabricating the semiconductor device includes the steps of forming a gate electrode and source and drain regions in an active region of a semiconductor substrate in which a field oxide film is formed, forming a capacitor lower electrode and a resistor on the field oxide film, forming an insulating film for prevention of silicide in a predetermined region on the resistor and the capacitor lower electrode, forming a silicide film on the gate electrode, the source and drain regions, and the resistor and the capacitor lower electrode on which the insulating film for prevention of silicide is not formed, and forming a capacitor upper electrode of metal material on the insulating film formed on the capacitor lower electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1A:
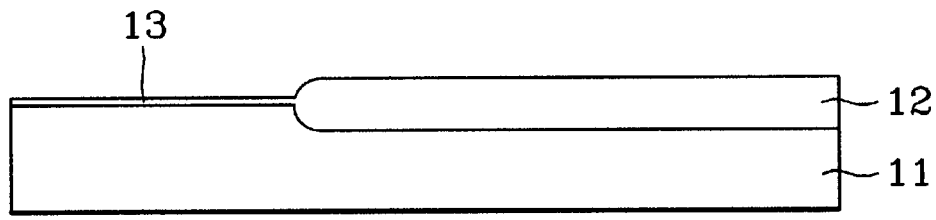
FIGS. 1a to 1e are sectional views illustrating a background art method for fabricating a semiconductor device.
Figure 1B:
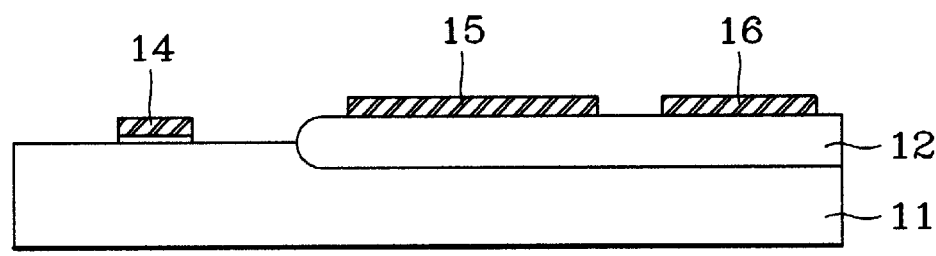
Figure 1C:
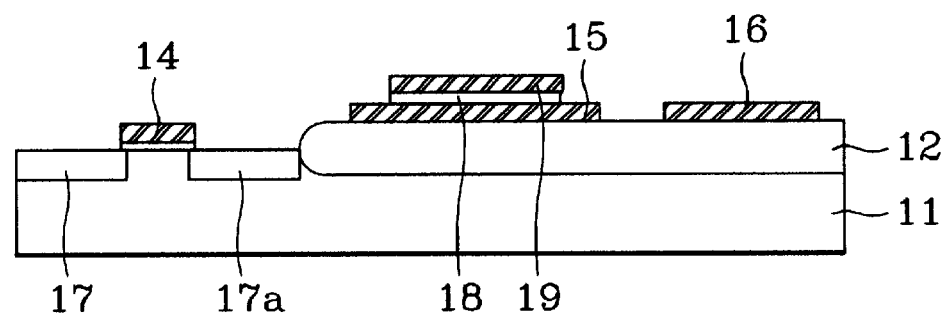
Figure 1D:
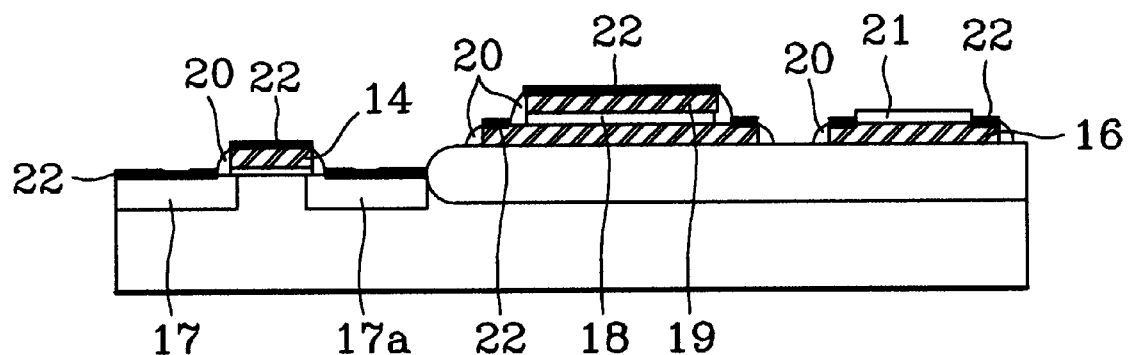
Figure 1E:
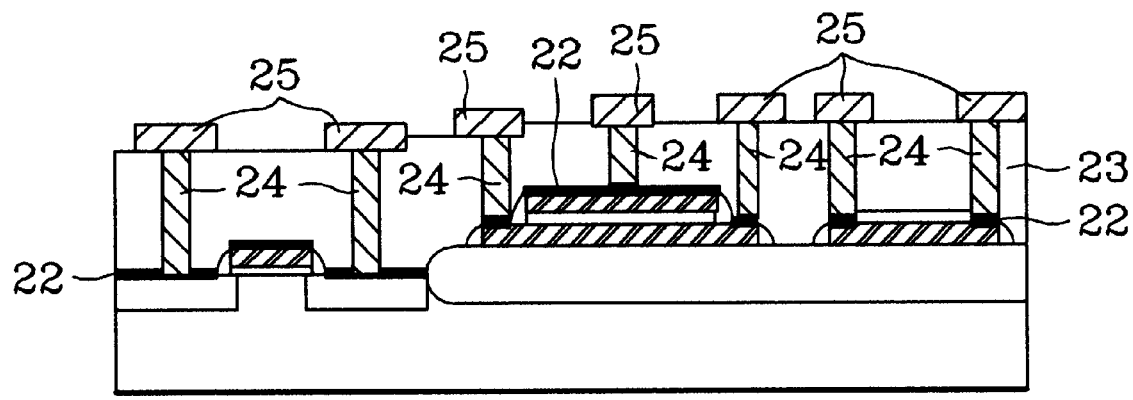
Figure 2:
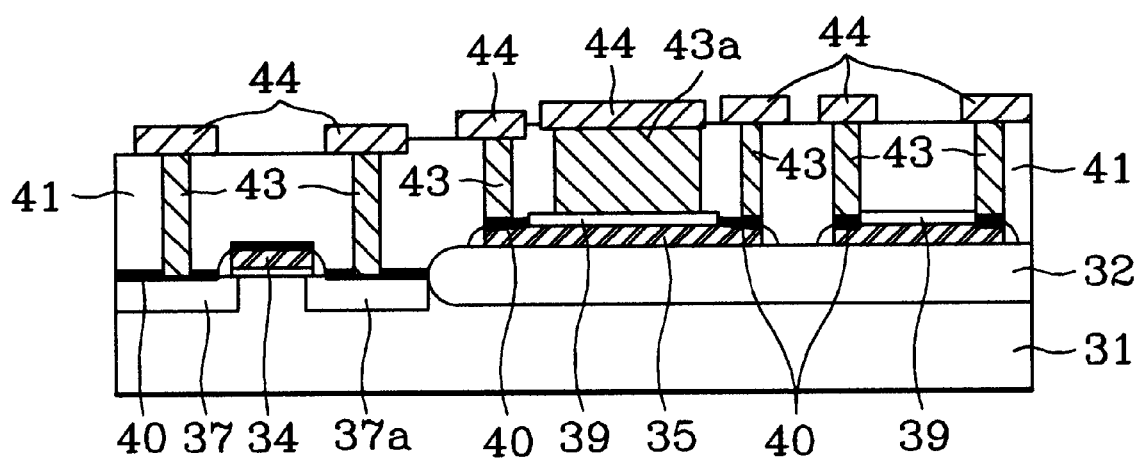
FIG. 2 is a sectional view illustrating a semiconductor device according to the present invention.

As shown in FIG. 2, a semiconductor device according to the present invention includes a semiconductor substrate 31, a gate electrode 34 and source and drain impurity ion diffusion regions 37 and 37a formed in an active region of the semiconductor substrate 31, a resistor 36 formed in a predetermined region on a field oxide film 32 formed in a field region of the semiconductor substrate 31, a capacitor lower electrode 35 formed of a doped polysilicon in a predetermined region on the field oxide film 32, and a capacitor upper electrode 43a formed of metal material on an insulating film 39 for prevention of silicide formed on the capacitor lower electrode 35.

The insulating film for prevention of silicide is formed in a predetermined region on the resistor 36.

A method for fabricating the semiconductor device according the present invention will be described with reference to FIGS. 3a to 3f.

Figure 3A:
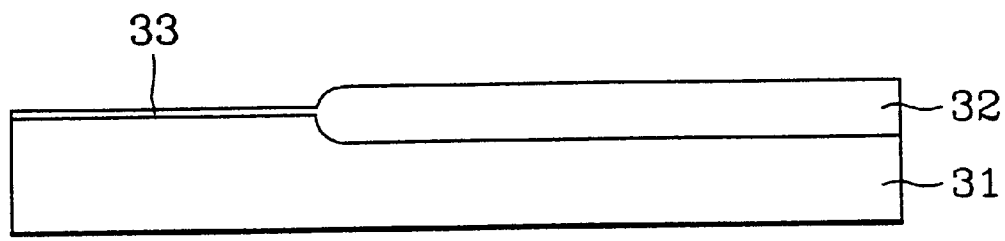
FIGS. 3a to 3f are sectional views illustrating a method for fabricating a semiconductor device according to the present invention.

As shown in FIG. 3a, a field oxide film 32 is formed in a field region of a semiconductor substrate 31 in which the field region and an active region are defined. Ions for adjustment of a threshold voltage are implanted into the active region of the semiconductor substrate 31. A gate insulating film 33 is then formed on the semiconductor substrate 31.

Figure 3B:
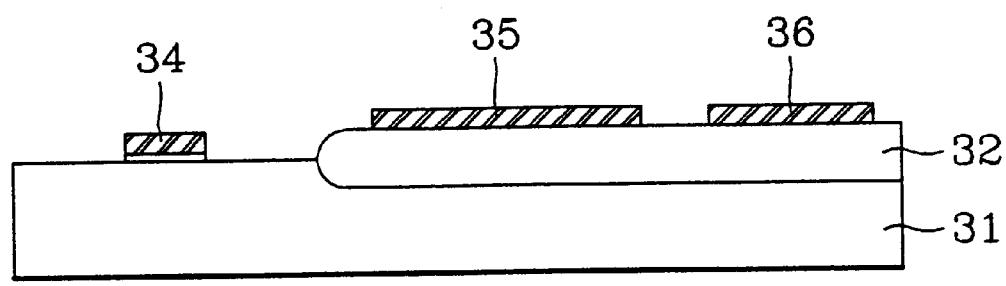

As shown in FIG. 3b, a doped polysilicon is deposited on an entire surface of the semiconductor substrate 31 including the field oxide film 32. The polysilicon is then selectively removed to form a gate electrode 34 of a MOS transistor, a capacitor lower electrode 35, and a resistor 36. At this time, the gate electrode 34 is formed on the active region of the semiconductor substrate 31, and the capacitor lower electrode 35 and the resistor 36 are formed on the field oxide film 32.

Figure 3C:
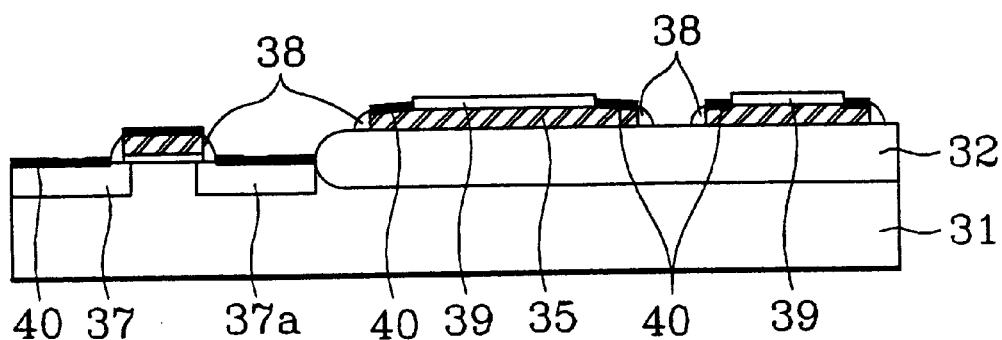

As shown in FIG. 3c, impurity ions are implanted into a surface of the semiconductor substrate 31 at both sides of the gate electrode 34 using the gate electrode 34 as a mask to form source and drain impurity ion diffusion regions 37 and 37a.

Thereafter, a sidewall 38 is formed at both sides of the gate electrode 34, the capacitor lower electrode 35 and the resistor 36. An insulating film 39 for prevention of silicide is formed on the entire surface of the semiconductor substrate 31 including the gate electrode 34. The insulating film 39 for prevention of silicide may be used as a capacitor dielectric film.

The insulating film 39 for prevention of silicide is selectively removed to remain on the center of the capacitor lower electrode 35 and the resistor 36.

A metal for the formation of silicide is formed on the entire surface of the semiconductor substrate 31 including the insulating film 39 for prevention of silicide and then annealed. Tungsten(W), cobalt(Co), Titanium(Ti) and the like may be used as the metal for formation of silicide.

Subsequently, the metal for the formation silicide, not silicided, is removed by etching and then a silicide film 40 is formed on the interface between silicon and metal. At this time, the silicide film is not formed on a portion where the insulating film 39 for prevention of silicide is formed.

Figure 3D:
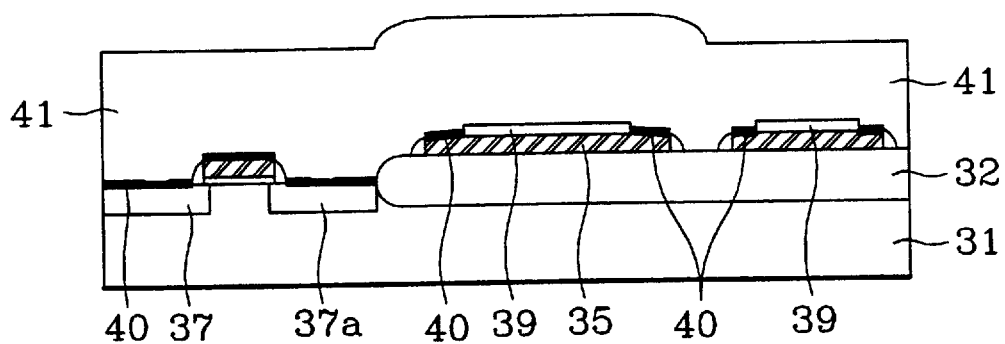

As shown in FIG. 3d, an insulating film 41 for inter metal poly (IMP) is thickly formed on the entire surface of the semiconductor substrate 31 including the silicide film 40.

Figure 3E:
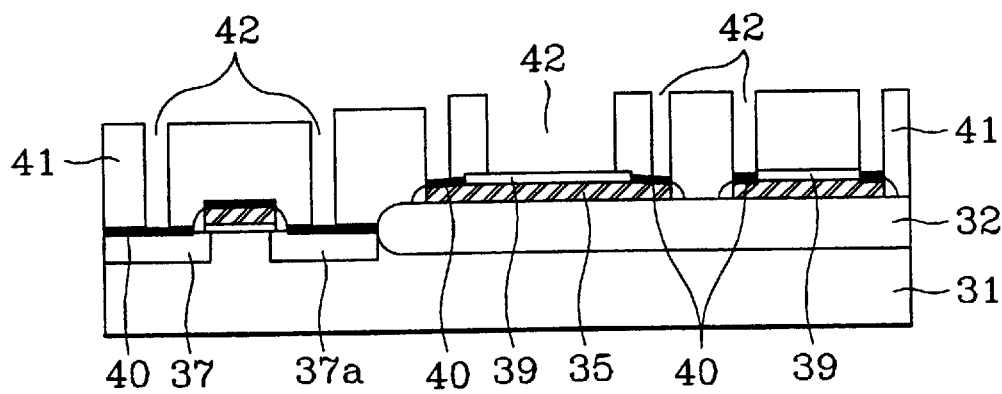

As shown in FIG. 3e, the insulating film 41 for IMP is selectively removed to expose the insulating film 39 and the silicide film 40. A contact hole 42 is then formed on the exposed insulating film 39 and silicide film 40. At this time, the silicide film 40 on the gate electrode 34 is not exposed.

Figure 3F:
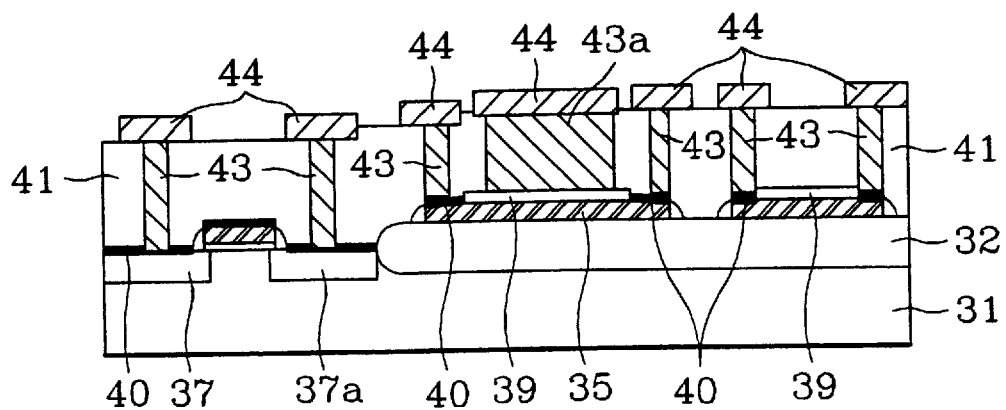

Subsequently, as shown in FIG. 3f, the contact hole 42 is plugged to form a plug 43 and a capacitor upper electrode 43a at the same time. A metal material not polysilicon is used as the plug 43.

Thereafter, a metal is deposited on the insulating film 40 for IMP including the capacitor upper electrode 43a and the plug 43 and then selectively removed to form a metal line 44. In other words, the capacitor upper electrode 43a is formed of metal material in the same manner as the plug 43.

As aforementioned, the semiconductor device and the method for fabricating the same according to the present invention have the following advantages.

Since the metal material is used as the capacitor upper electrode, a separate process step of forming the capacitor upper electrode is not required, thereby improving voltage coefficient characteristic. In addition, since the insulating film 39 for prevention of silicide is used as a capacitor dielectric film, a separate process step of forming the capacitor dielectric film is not required.

It will be apparent to those skilled in the art that various modifications and variations can be made in the semiconductor device and the method for fabricating the same according to the present invention without departing from the spirit or scope of the invention. Thus, it is intended that the present invention covers the modifications and variations of the invention provided they come within the scope of the appended claims and their equivalents.

What is claimed is:

1. A method for fabricating a semiconductor devices, comprising:

forming a gate electrode and source and drain regions in an active region of a semiconductor substrate in which a field oxide film is formed;

forming a capacitor lower electrode and a resistor on the field oxide film;

forming an insulating film for prevention of suicide in a predetermined region on the resistor and the capacitor lower electrode;

forming a silicide film on the gate electrode, on the source and drain regions, and on the resistor and the capacitor lower electrode where the insulating film for prevention of silicide is not formed;

forming a capacitor upper electrode of metal material on the insulating film formed on the capacitor lower electrode; and forming simultaneously with the capacitor upper electrode a plug of the metal material, and the plug contacting the silicide film.

2. The method as claimed in claim 1, wherein the gate electrode, the capacitor lower electrode, and the resistor are formed of doped polysilicon.

3. The semiconductor device as claimed in claim 2, wherein the forming of the gate electrode, the capacitor lower electrode and the resistor include:

forming a field oxide film in the field region of the semiconductor substrate to define an active region;

implanting ions for adjustment of a threshold voltage into the active region of the semiconductor substrate;

forming a gate insulating film on the semiconductor substrate;

depositing a doped polysilicon on the entire surface of the semiconductor substrate including the field oxide film; and selectively removing the doped polysilicon to form the gate electrode on the active region of the semiconductor substrate and to form the capacitor lower electrode and the resistor on the field oxide film.

4. The method as claimed in claim 1, wherein insulating film for prevention of silicide is used as a dielectric film between the capacitor lower electrode and the capacitor upper electrode.

5. The method as claimed in claim 1, wherein the forming of the capacitor upper electrode includes steps:

forming an insulating film for inter metal poly on an entire surface of the semiconductor substrate in which the suicide film is formed;

selectively removing the insulating film for inter metal poly to expose the insulating film for prevention of silicide formed on the capacitor lower electrode and the silicide film and form a contact hole; and plugging the metal material in the contact hole to form the plug and the capacitor upper electrode.

6. A method for forming a capacitor, comprising:

forming a capacitor lower electrode on a substrate, wherein the capacitor lower electrode is formed on a field oxide on a surface of a semiconductor substrate;

forming an insulating film on the capacitor lower electrode;

forming a silicide film on the capacitor lower electrode;

forming a capacitor upper electrode on the insulating film;

forming a plug contacting the silicide film, wherein the capacitor upper electrode and the plug are simultaneously formed, and are made of a metal material.

7. The method of claim 6, wherein the silicide film is formed on a portion of the capacitor lower electrode not covered by the insulating film and the plug contacts the silicide film formed on the portion of the capacitor lower electrode.

8. The method of claim 6, wherein forming the capacitor upper electrode includes:

forming an insulating film for inter metal poly on an entire surface of the semiconductor substrate;

selectively removing portions of the insulating film for inter metal poly to form contact holes that expose the insulating film formed on the capacitor lower electrode and the suicide film; and plugging the contact holes with a metal material to form the plug and the capacitor upper electrode.

9. The method of claim 6, wherein the capacitor upper electrode substantially covers an entire surface of the insulating film.

* * * * *